(12) United States Patent
Matsumoto (10) Patent No.: US 11,456,716 B2
(45) Date of Patent: Sep. 27, 2022

(54) ELASTIC WAVE DEVICE AND MANUFACTURING METHOD THEREOF

(71) Applicant: Murata Manufacturing Co., Ltd., Nagaokakyo (JP)

(72) Inventor: Katsuya Matsumoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 1224 days.

(21) Appl. No.: 15/933,506

(22) Filed: Mar. 23, 2018

(65) Prior Publication Data

US 2018/0212581 A1 Jul. 26, 2018

Related U.S. Application Data

(63) Continuation of application No. PCT/JP2016/076988, filed on Sep. 13, 2016.

(30) Foreign Application Priority Data

Nov. 17, 2015 (JP) .............................. JP2015-224940

(51) Int. Cl.
*H03H 9/02* (2006.01)
*H03H 3/08* (2006.01)
(Continued)

(52) U.S. Cl.
CPC .......... *H03H 3/08* (2013.01); *H03H 9/02535* (2013.01); *H03H 9/02622* (2013.01);
(Continued)

(58) Field of Classification Search
CPC ...... H03H 9/02535; H03H 9/145; H03H 9/25; H03H 3/08
(Continued)

(56) References Cited

U.S. PATENT DOCUMENTS

2011/0068655 A1 3/2011 Solal et al.
2012/0133246 A1* 5/2012 Yaoi ....................... H03H 9/131
310/313 C
(Continued)

FOREIGN PATENT DOCUMENTS

JP 2012-186808 A 9/2012
JP 2013-544041 A 12/2013
(Continued)

OTHER PUBLICATIONS

Official Communication issued in International Patent Application No. PCT/JP2016/076988, dated Dec. 6, 2016.

*Primary Examiner* — Derek J Rosenau
(74) *Attorney, Agent, or Firm* — Keating & Bennett, LLP (57) ABSTRACT

An elastic wave device includes an IDT electrode on a piezoelectric substrate, in which the IDT electrode includes first electrode fingers and second electrode fingers, where a portion in which the first electrode fingers and the second electrode fingers overlap with each other in an elastic wave propagation direction is defined as an intersection region including in a direction in which the first and second electrode fingers extend, a center region located on a center side and first and second edge regions respectively located on both sides of the center region, in the first and second edge regions, grooves defining recess portions are provided on the piezoelectric substrate, the first and second electrode fingers are provided inside of the grooves as the recess portions and are disposed on the piezoelectric substrate in the grooves.

18 Claims, 7 Drawing Sheets

(51) Int. Cl.
  *H03H 9/145* (2006.01)
  *H03H 9/25* (2006.01)
  *H03H 9/46* (2006.01)

(52) U.S. Cl.
  CPC ........ *H03H 9/02858* (2013.01); *H03H 9/145* (2013.01); *H03H 9/25* (2013.01); *H03H 9/46* (2013.01)

(58) Field of Classification Search
  USPC ...... 310/313 R, 313 A, 313 B, 313 C, 313 D
  See application file for complete search history.

(56) References Cited

U.S. PATENT DOCUMENTS

| | | |
|---|---|---|
| 2013/0051588 A1 | 2/2013 | Ruile et al. |
| 2013/0249647 A1 | 9/2013 | Nakanishi et al. |
| 2015/0280689 A1 | 10/2015 | Nakamura et al. |
| 2016/0336919 A1 | 11/2016 | Taniguchi |

FOREIGN PATENT DOCUMENTS

| | | |
|---|---|---|
| JP | 2015-188123 A | 10/2015 |
| WO | 2011/088904 A1 | 7/2011 |
| WO | 2015/119025 A1 | 8/2015 |

\* cited by examiner

ELASTIC WAVE DEVICE AND MANUFACTURING METHOD THEREOF

CROSS REFERENCE TO RELATED APPLICATIONS

This application claims the benefit of priority to Japanese Patent Application No. 2015-224940 filed on Nov. 17, 2015 and is a Continuation Application of PCT Application No. PCT/JP2016/076988 filed on Sep. 13, 2016. The entire contents of each application are hereby incorporated herein by reference.

BACKGROUND OF THE INVENTION

1. Field of the Invention

The present invention relates to an elastic wave device and manufacturing method thereof, and particularly, to an elastic wave device that utilizes a piston mode and a manufacturing method thereof.

2. Description of the Related Art

An existing elastic wave device using a piston mode has been proposed in order to suppress transverse mode spurious emission. International Publication No. WO2011/088904 A1 discloses an elastic wave device using a piston mode. The elastic wave device disclosed in International Publication No. WO2011/088904 A1 includes an intersection region in which a plurality of first electrode fingers and a plurality of second electrode fingers are overlapping with each other when viewed in an elastic wave propagation direction. Additionally, this intersection region includes a center region in a direction in which the first and second electrode fingers extend and first and second edge regions provided in outer side portions of the center region in the direction in which the first and second electrode fingers extend. Acoustic velocities in the first and second edge regions are made to be lower than an acoustic velocity in the center region. Acoustic velocities in regions in outer side portions of the intersection region are made to be higher than the acoustic velocities of the first and second edge regions. By these acoustic velocity differences, transverse mode spurious emission is suppressed. In order to obtain the above-described acoustic velocity differences, International Publication No. WO2011/088904 A1 discloses a method in which widths of the first and second electrode fingers are increased in the edge regions, and a structure in which electrodes are stacked in order to add mass to the first and second electrode fingers in the edge regions.

However, as described above, by only widening the widths of the first and second electrode fingers in the edge regions, the acoustic velocities in the edge regions cannot be sufficiently lowered. Additionally, in the structure in which the widths of the first and second electrode fingers are widened in the edge regions, it is difficult to reduce a dimension in an elastic wave propagation direction. Accordingly, it is difficult to achieve a reduction in the size.

SUMMARY OF THE INVENTION

Preferred embodiments of the present invention provide elastic wave devices that utilize a piston mode, elastic wave devices that are capable of sufficiently increasing an acoustic velocity difference between an edge region and a center region, and manufacturing methods thereof, while achieving a reduction in size of the elastic wave devices.

An elastic wave device according to a preferred embodiment of the present invention includes a piezoelectric substrate, and an interdigital transducer (IDT) electrode provided on the piezoelectric substrate, in which the IDT electrode includes a first busbar, a second busbar arranged separated from the first busbar, a plurality of first electrode fingers each of which includes one end that is connected to the first busbar, and a plurality of second electrode fingers each of which includes one end that is connected to the second busbar, the plurality of first electrode fingers and the plurality of second electrode fingers are interdigitated with each other, in a case where a portion at which the first electrode fingers and the second electrode fingers overlap with one another in an elastic wave propagation direction is defined as an intersection region, the intersection region includes, in a direction in which the first and second electrode fingers extend, a center region located at a central portion and first and second edge regions respectively arranged on both sides of the center region, in the first and second edge regions, recess portions are provided on the piezoelectric substrate, the first and second electrode fingers enter the recess portions, and are disposed on the piezoelectric substrate in the recess portions.

In an elastic wave device according to a preferred embodiment of the present invention, where an acoustic velocity of elastic waves in the center region is represented by V1, an acoustic velocity of elastic waves in the first and second edge regions is represented by V2, an acoustic velocity of elastic waves in regions on sides of the first and second edge regions opposite from the center region is represented by V3, V3>V1>V2 is satisfied.

In an elastic wave device according to a preferred embodiment of the present invention, an acoustic velocity difference between the acoustic velocity V1 and the acoustic velocity V2 is not less than about 200 m/sec and not more than about 340 m/sec. In this case, transverse mode spurious emission is even more effectively reduced or prevented.

In an elastic wave device according to a preferred embodiment of the present invention, a portion of each of the first and second electrode fingers in the recess portion is made of a material with a lower Young's modulus than that of the piezoelectric substrate. In this case, the acoustic velocity in the first and second edge regions is more effectively reduced.

In an elastic wave device according to a preferred embodiment of the present invention, the portion of each of the first and second electrode fingers in the recess portion is made of metal. Additionally, as the metal, at least one metal layer selected from a group consisting of Au, Cu, Pt, W, and Al or an alloy including the at least one metal as the primary component is preferably used.

In an elastic wave device according to a preferred embodiment of the present invention, a density of the portion of each of the first and second electrode fingers in the recess portion is higher than a density of the piezoelectric substrate. In this case, the acoustic velocity in the first and second edge regions is more effectively reduced as compared to that in the center region. Preferably, the portion in the recess portion is includes one metal selected from a group consisting of Au, Cu, Pt, and W or an alloy including the metal as the primary component. In this case, the acoustic velocity in the first and second edge regions is even more sufficiently reduced.

In an elastic wave device according to a preferred embodiment of the present invention, the recess portion is a groove extending in the elastic wave propagation direction.

In an elastic wave device according to a preferred embodiment of the present invention, a cross-sectional shape of the groove along the direction in which the first and second electrode fingers extend is an inverted trapezoidal shape. In this case, a plurality of types of unnecessary waves are even more effectively reduced or prevented.

In an elastic wave device according to a preferred embodiment of the present invention, a cross-sectional shape of the groove along the direction in which the first and second electrode fingers extend is a rounded shape. In this case, the plurality of types of unnecessary waves are even more effectively reduced or prevented.

In an elastic wave device according to a preferred embodiment of the present invention, the groove extends across an entire or substantially an entire width in a width direction of the first electrode finger or the second electrode finger in the elastic wave propagation direction. In this case, in the first and second edge regions, the acoustic velocity is even more effectively reduced.

In an elastic wave device according to a preferred embodiment of the present invention, the groove has a dimension not more than a dimension in the width direction of the first or second electrode finger along the elastic wave propagation direction.

In an elastic wave device according to a preferred embodiment of the present invention, the groove is larger than the dimension in the width direction of the first or second electrode finger in the elastic wave propagation direction, and extends to an outer side portion in the elastic wave propagation direction over end edges in the width direction of the first and second electrode fingers.

In an elastic wave device according to a preferred embodiment of the present invention, the groove connects the recess portions of the plurality of first electrode fingers or the plurality of second electrode fingers. In this case, in the first and second edge regions, the groove is able to be formed with ease.

A manufacturing method of an elastic wave device according to a preferred embodiment of the present invention includes forming an IDT electrode including a first busbar, a second busbar, a plurality of first electrode fingers, and a plurality of second electrode fingers on one main surface of a piezoelectric substrate, a plurality of recess portions being provided on the one main surface, in which when forming the IDT electrode, in an intersection region at which the plurality of first and second electrode fingers overlap with each other when viewed from an elastic wave propagation direction, the intersection region includes a center region and first and second edge regions located in outer side portions of the center region in a direction in which the first and second electrode fingers extend, and when forming the IDT electrode, the IDT electrode is formed such that the recess portions are located in the first and second edge regions.

In a manufacturing method of the elastic wave device according to a preferred embodiment of the present invention, a metal film being a second layer is film-formed on at least a portion of each of the first and second busbars.

With elastic wave devices and manufacturing methods thereof according to preferred embodiments of the present invention, in elastic wave devices that utilize a piston mode, an acoustic velocity difference between an edge region and a center region is sufficiently increased. Additionally, a size is able to be reduced, and a cost is also able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings.

Note that the various preferred embodiments disclosed in the present specification are merely examples, and it is to be understood that partial replacements or combinations of configurations among different preferred embodiments are also possible.

Figure 1A:
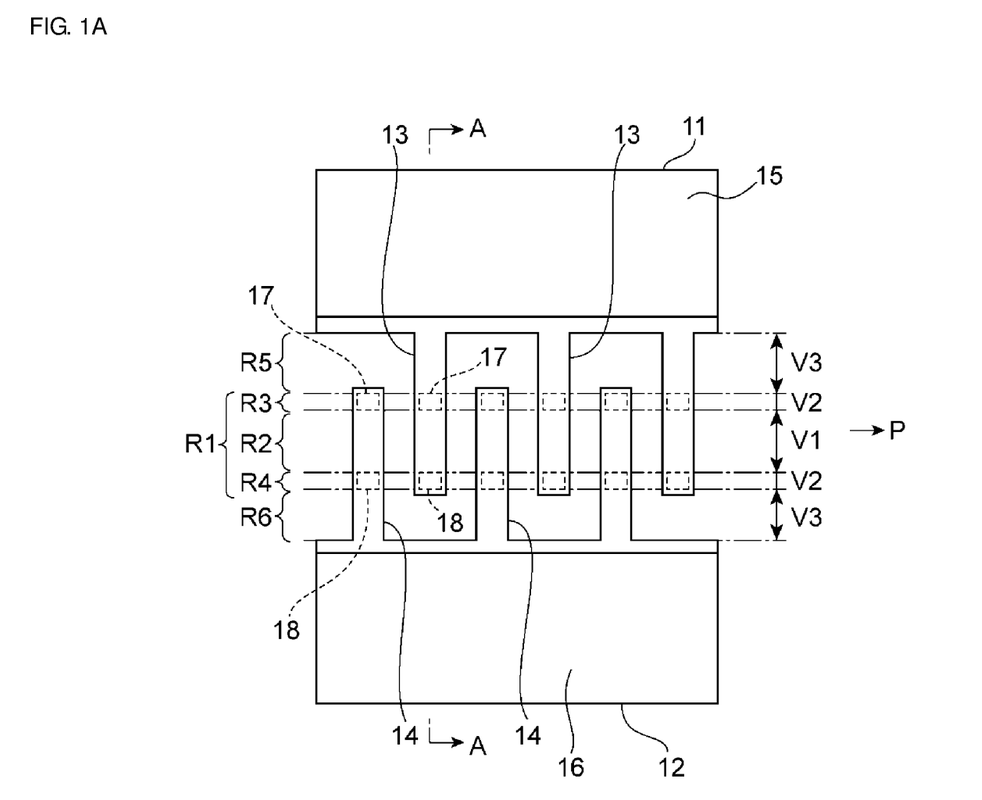
FIGS. 1A and 1B are a schematic plan view illustrating an electrode structure of an elastic wave device according to a preferred embodiment of the present invention and a cross-sectional view of a portion corresponding to a portion along an A-A line in FIG. 1A, respectively.
Figure 1B:
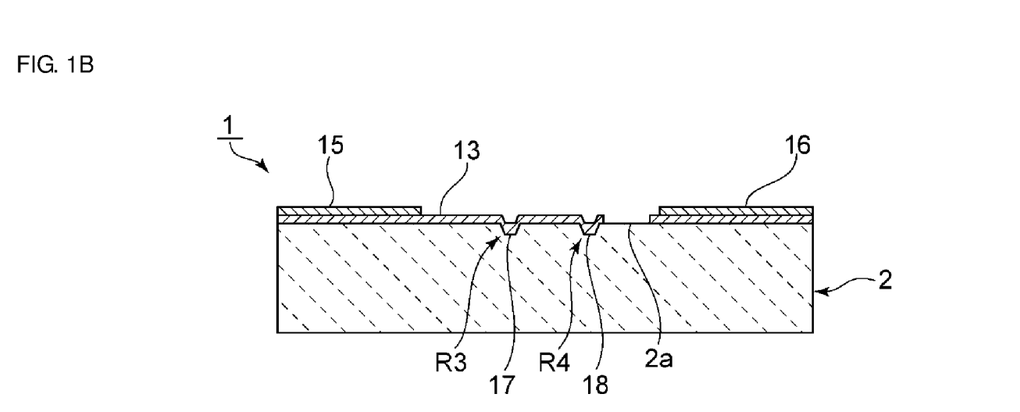
Figure 2:
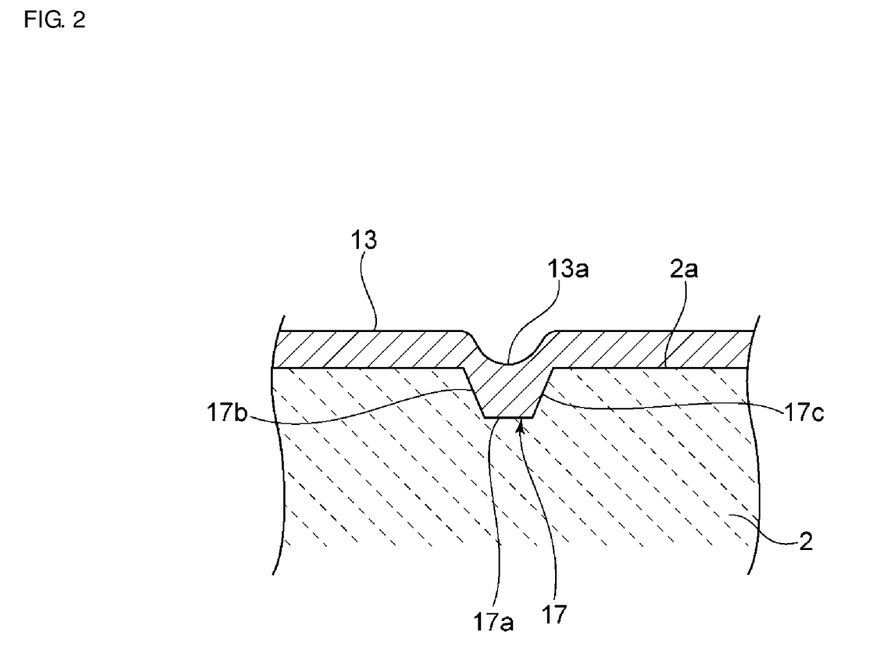
FIG. 2 is a partial cutout enlarged cross-sectional view illustrating primary elements in FIG. 1A in an enlarged manner.
Figure 3:
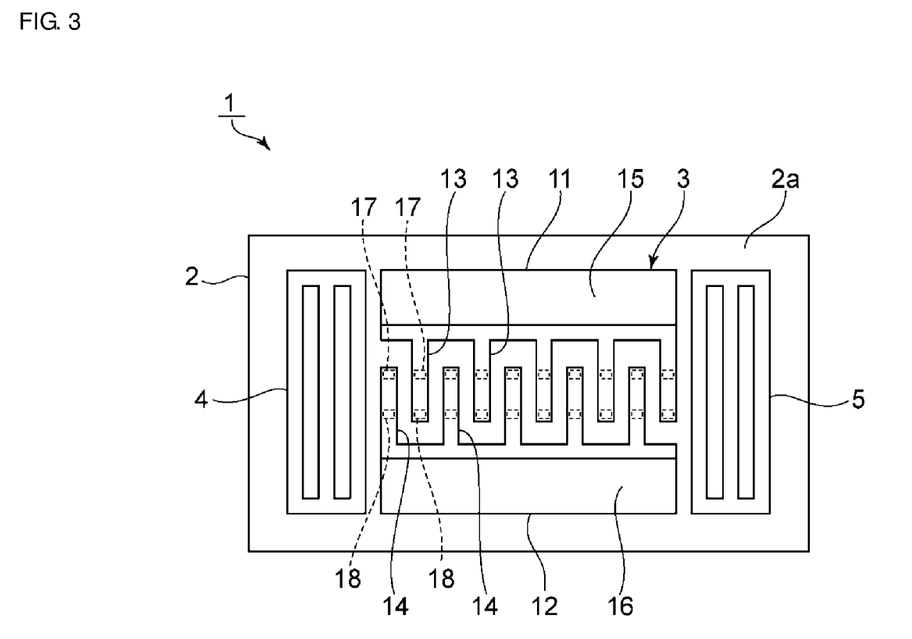
FIG. 3 is a rough plan view illustrating an entire structure of the elastic wave device according to a preferred embodiment of the present invention.

FIG. 3 is a rough plan view illustrating an entire structure of an elastic wave device according to a preferred embodiment of the present invention, FIG. 1A is a schematic plan view illustrating an electrode structure thereof. FIG. 1B is a cross-sectional view of a portion corresponding to a portion along an A-A line in FIG. 1A, FIG. 2 is a partial cutout enlarged cross-sectional view illustrating primary elements in FIG. 1A in an enlarged manner.

As illustrated in FIG. 3, an elastic wave device 1 includes a piezoelectric substrate 2. The piezoelectric substrate 2 is preferably made of a piezoelectric single crystal, such as LiTaO$_3$, LiNbO$_3$, or other suitable piezoelectric single crystal, for example. The piezoelectric substrate 2 may be made of piezoelectric ceramics. Additionally, the piezoelectric substrate 2 may have a structure in which a piezoelectric film is provided on an insulating substrate.

In the present preferred embodiment, the piezoelectric substrate 2 is preferably made of a Y-cut LiTaO$_3$. On the piezoelectric substrate 2, an IDT electrode 3 is provided. Reflectors 4 and 5 are respectively provided on both sides of the IDT electrode 3 in an elastic wave propagation direction. With this structure, a single-port type elastic wave resonator is provided.

The IDT electrode 3 includes a first busbar 11 and a second busbar 12 separated from the first busbar 11. One end of each of a plurality of first electrode fingers 13 is connected to the first busbar 11. One end of each of a plurality of second electrode fingers 14 is connected to the second busbar 12. The plurality of first electrode fingers 13 and the plurality of second electrode fingers 14 are interdigitated with each other.

Although not required, on the first busbar 11, a metal film 15 defining a second layer is preferably provided. In the same or similar manner, on the second busbar 12, a metal film 16 defining a second layer is preferably provided. Although the metal films 15 and 16 are not required elements, providing the metal films 15 and 16 makes it possible to reduce loss. Additionally, acoustic velocities of portions at which the first and second busbars 11 and 12 are provided are able to be further reduced.

The IDT electrode 3 and the reflectors 4 and 5 are made of an appropriate metal or alloy. However, in a portion in which each of the first and second electrode fingers 13 and 14 are disposed inside of a recess portion in an edge region, which will be described later, a preferable metal, which will be described later, is used.

As illustrated in FIG. 1A, the first electrode fingers 13 and the second electrode fingers 14 partially overlap with each other when viewed from an elastic wave propagation direction P. This overlapping region R1 is an intersection region. An intersection region R1 includes a center region R2 and first and second edge regions R3 and R4 which are respectively provided on both sides of the center region R2 in a direction in which the first and second electrode fingers 13 and 14 extend. The center region R2 is a region that is sandwiched by the first and second edge regions R3 and R4, and is located in the center or approximate center of the intersection region R1 in the direction in which the first and second electrode fingers 13 and 14 extend.

In an outer side portion of the first edge region R3, a first gap region R5 is provided. The first gap region R5 is located between the first busbar 11 and tips of the second electrode fingers 14. Similarly, in an outer side portion of the second edge region R4 in the direction in which the first and second electrode fingers 13 and 14 extend, a second gap region R6 is provided. The second gap region R6 is a region between tips of the first electrode fingers 13 and the second busbar 12.

As illustrated in FIG. 1B, in the first and second edge regions R3 and R4, on one main surface 2a of the piezoelectric substrate 2, grooves 17 and 18 defining recess portions are provided. The first electrode filter 13 is defined by a metal film including portions that are disposed in the grooves 17 and 18. In other words, the first electrode finger 13 are disposed inside of the grooves which define the recess portions, and is provided on the piezoelectric substrate 2 in the grooves. Although a cross-sectional structure is omitted, the second electrode finger 14 is also disposed in the grooves defining the recess portions in the first and second edge regions R3 and R4 in the same or substantially the same manner.

As enlarged and illustrated in FIG. 2, the groove 17 includes a bottom surface 17a and side surfaces 17b and 17c connecting the bottom surface and the one main surface 2a of the piezoelectric substrate 2. In the present preferred embodiment, the side surfaces 17b and 17c are sloped so as to be closer to each other as the side surfaces progress toward the bottom surface 17a side. Accordingly, the groove 17 preferably has an inverted trapezoidal shape in a cross section along the elastic wave propagation direction.

In a portion in which the first electrode finger 13 is disposed in the groove 17, an upper surface 13a thereof is recessed in accordance with a cross-sectional shape of the groove 17. By providing the groove 17 on the one main surface 2a of the piezoelectric substrate 2 and causing a portion of the first electrode finger 13 to be disposed in the groove 17, in the first edge region R3 in which the groove 17 is provided, an elastic wave propagate rate is able to be reduced.

In FIG. 1A, acoustic velocities in the center region R2, the first and second edge regions R3 and R4, and the first and second gap regions R5 and R6 are illustrated using symbols of V1, V2, and V3, respectively, in a right side of the electrode structure. The acoustic velocity V1 in the center region R2, the acoustic velocity V2 in each of the first and second edge regions R3 and R4, and the acoustic velocity V3 in each of the first and second gap regions R5 and R6 preferably have a relationship of V3>V1>V2. In other words, since the first and second gap regions R5 and R6 have the lowest metallization ratio, the acoustic velocity V3 is high. On the other hand, in the first and second edge regions R3 and R4, portions of the first electrode finger 13 are disposed inside of the grooves 17 and 18, and portions of the second electrode finger 14 are also disposed inside of the grooves in the same or substantially the same manner. Accordingly, the acoustic velocity V2 is sufficiently reduced as compared to the acoustic velocity V1 in the center region R2.

A characteristic of the elastic wave device 1 is that the first and second electrode fingers 13 and 14 are provided such that the first and second electrode fingers 13 and 14 are disposed inside of the grooves 17 and 18 in the first and second edge regions R3 and R4. With this structure, an acoustic velocity difference between the acoustic velocity V1 in the center region R2 and the acoustic velocity V2 in each of the first and second edge regions R3 and R4 is able to be made sufficiently large. Accordingly, transverse modes are effectively reduced or prevented. In this case, it is not necessary to provide a portion in which an electrode finger width is wide in the first and second electrode fingers. Thus, the size is able to be reduced, and an electric power handling capability is able to be improved.

Furthermore, in an existing edge region, in a method in which electrodes are stacked in order to add mass to first and second electrode fingers, a plurality of film-forming steps are performed. Accordingly, the cost increases. In contrast, in the present preferred embodiment, as is clear from a manufacturing method, which will be described later, only by film-forming the electrode structure including the first and second electrode fingers 13 and 14 after providing the recess portions, the first and second edge regions R3 and R4 are able to be easily formed. Accordingly, it is not necessary to perform many steps for forming the edge region, and the cost is therefore reduced.

Note that, the acoustic velocities are lowered by providing the first and second electrode fingers 13 and 14 so as to be disposed in the grooves 17 and 18 defining the recess portions, because a Young's modulus of the metal is lower than that of a piezoelectric single crystal defining the piezoelectric substrate 2. In other words, since the material has the low Young's modulus and is soft, the acoustic velocities are lowered. It is more preferable that a density of the material defining the first and second electrode fingers 13 and 14 which are disposed in the recess portions be higher than a density of the material defining the piezoelectric substrate 2. With this configuration as well, the acoustic velocities are able to be lowered.

Table 1 to Table 4 below, show acoustic velocities in a case in which electrodes made of Cu, Pt, Au or Al, respectively, are provided on the piezoelectric substrate, acoustic velocities in a case in which the electrodes are embedded in the grooves, and acoustic velocity differences therebetween.

TABLE 1

Cu

| Electrode Film | Acoustic Velocity Unit [m/s] | | |
|---|---|---|---|
| Thickness h/λ [%] | on Piezoelectric Substrate | Embedded Structure | Acoustic Velocity Difference |
| 1 | 4069.1 | 4000.4 | 68.7 |
| 2 | 3996.7 | 3894.7 | 102.0 |
| 3 | 3921.4 | 3781.1 | 140.3 |
| 4 | 3841.7 | 3657.4 | 184.3 |
| 5 | 3761.4 | 3524.5 | 236.9 |
| 6 | 3682.0 | 3384.1 | 297.9 |
| 7 | 3601.7 | 3241.2 | 360.5 |
| 8 | 3522.0 | 3095.9 | 426.1 |
| 9 | 3443.4 | 2952.8 | 490.6 |
| 10 | 3366.3 | 2812.9 | 553.4 |

TABLE 2

Pt

| Electrode Film | Acoustic Velocity Unit [m/s] | | |
|---|---|---|---|
| Thickness h/λ [%] | on Piezoelectric Substrate | Embedded Structure | Acoustic Velocity Difference |
| 1 | 3941.3 | 3904.0 | 37.3 |
| 2 | 3771.2 | 3671.9 | 99.3 |
| 3 | 3593.9 | 3419.4 | 174.5 |
| 4 | 3422.6 | 3169.7 | 252.9 |
| 5 | 3263.9 | 2936.8 | 327.2 |
| 6 | 3120.1 | 2725.8 | 394.3 |
| 7 | 2990.7 | 2544.9 | 445.8 |
| 8 | 2874.4 | 2340.0 | 534.4 |
| 9 | 2769.7 | 2190.4 | 579.3 |
| 10 | 2675.0 | 2052.2 | 622.9 |

TABLE 3

Au

| Electrode Film | Acoustic Velocity Unit [m/s] | | |
|---|---|---|---|
| Thickness h/λ [%] | on Piezoelectric Substrate | Embedded Structure | Acoustic Velocity Difference |
| 1 | 3951.2 | 3916.4 | 34.8 |
| 2 | 3786.5 | 3697.0 | 89.5 |

TABLE 3-continued

Au

| Electrode Film | Acoustic Velocity Unit [m/s] | | |
|---|---|---|---|
| Thickness h/λ [%] | on Piezoelectric Substrate | Embedded Structure | Acoustic Velocity Difference |
| 3 | 3601.1 | 3443.0 | 158.1 |
| 4 | 3409.0 | 3176.7 | 232.3 |
| 5 | 3222.1 | 2919.3 | 302.8 |
| 6 | 3048.3 | 2686.0 | 362.3 |
| 7 | 2890.8 | 2438.7 | 452.1 |
| 8 | 2749.9 | 2250.7 | 499.2 |
| 9 | 2624.7 | 2078.3 | 546.3 |
| 10 | 2513.3 | 1924.3 | 589.1 |

TABLE 4

Al

| Electrode Film | Acoustic Velocity Unit [m/s] | | |
|---|---|---|---|
| Thickness h/λ [%] | on Piezoelectric Substrate | Embedded Structure | Acoustic Velocity Difference |
| 1 | | | |
| 2 | | | |
| 3 | | | |
| 4 | 3859.4 | 3837.7 | 21.7 |
| 5 | 3802.4 | 3755.0 | 47.4 |
| 6 | 3741.0 | 3670.6 | 70.5 |
| 7 | 3676.0 | 3585.3 | 90.7 |
| 8 | 3608.8 | 3500.5 | 108.3 |
| 9 | 3537.8 | 3412.7 | 125.1 |
| 10 | 3463.0 | 3329.6 | 133.3 |
| 11 | 3405.4 | 3244.7 | 160.7 |
| 12 | 3339.3 | 3159.7 | 179.5 |
| 13 | 3273.2 | 3074.8 | 198.4 |
| 14 | 3207.1 | 2989.8 | 217.3 |

As is clear from Table 1 to Table 4, when any metal is used, acoustic velocities are lowered in the structure in which the electrode fingers are embedded as compared to the structure in which electrodes are provided on the piezoelectric substrate. Note that, h in the electrode film thickness h/λ in Table 1 to Table 4 represents a film thickness. Additionally, λ represents a wave length determined by an electrode finger pitch of the IDT electrode. Accordingly, as is clear from Table 1, by making the electrode film thickness h/λ not less than about 5% in a case in which Cu is used, the acoustic velocity difference between the acoustic velocity V1 in the center region R2 and the acoustic velocity V2 in the first and second edge regions R3 and R4 in which the grooves 17 and 18 are provided is not less than about 200 m/sec, for example. By making the electrode film thickness h/λ not less than about 4% in a case in which Pt is used in the same or similar manner, and not less than about 4% in a case in which Au is used in the same or similar manner, the acoustic velocity difference is not less than about 200 m/sec, for example. Where Al is used, as is clear from Table 4, the electrode film thickness h/λ may be made not less than about 14% since the density of Al is low, in this a case as well, the acoustic velocity difference is not less than about 200 m/sec, for example.

In order to increase the above-described acoustic velocity difference between the acoustic velocity V1 in the center region R2 and the acoustic velocity V2 in the first and second edge regions R3 and R4, in the first and second electrode fingers 13 and 14, the portion disposed inside of the recess portion is preferably made of a material with the lower Young's modulus than that of the piezoelectric substrate 2. With this structure, the acoustic velocity difference is able to be effectively increased. Accordingly, it is preferable that the portions of the first and second electrode fingers disposed inside of the recess portions be made of metal. Additionally, it is more preferable that, as the metal, at least one metal layer selected from a group consisting of Au, Cu, Pt, W, and Al or an alloy including the at least one metal as its primary component is used. The alloy that includes the at least one metal as its primary component refers to an alloy that includes the at least one metal of more than 50 wt %. In a case of the metal or the alloy, the acoustic velocity difference is even more effectively increased. As described above, the metal may include one metal layer, or may include a multilayer body including a plurality of metal layers.

Additionally, it is preferable that the density of the portions of the first and second electrode fingers 13 and 14 disposed in the recess portions be higher than the density of the piezoelectric substrate 2. In this case the acoustic velocity difference is able to be effectively increased. Accordingly, it is even more preferable that the portions of the first and second electrode fingers disposed in the recess portions be made of one metal selected from a group consisting of Au, Cu, Pt, and W or an alloy including the metal as its primary component. In this case, the acoustic velocity difference is even more effectively increased.

Figure 4:
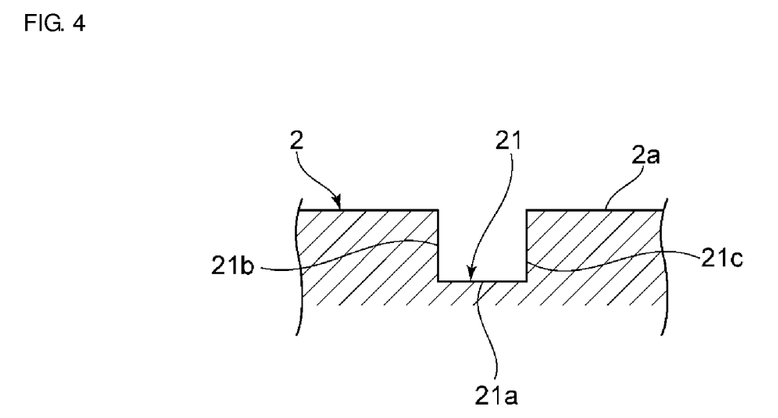
FIG. 4 is a partial cutout enlarged cross-sectional view illustrating a variation on a cross-sectional shape of a groove.

Although, in the above-described preferred embodiment, the grooves 17 and 18 defining the recess portions are provided, the shape of the recess portion is not limited thereto. FIG. 4 is a partial cutout enlarged cross-sectional view illustrating a variation on the groove as the recess portion. In the variation illustrated in FIG. 4, a groove 21 defining the recess portion is provided. The groove 21 includes a bottom surface 21a extending in parallel or substantially in parallel to the one main surface 2a of the piezoelectric substrate 2, and side surfaces 21b and 21c connecting the bottom surface 21a and the one main surface 2a. The side surfaces 21b and 21c extend in a direction orthogonal or substantially orthogonal to the bottom surface 21a and the one main surface 2a. Accordingly, in a cross section along the direction in which the first and second electrode fingers extend, the groove 21 has a rectangular or substantially rectangular shape.

Figure 5:
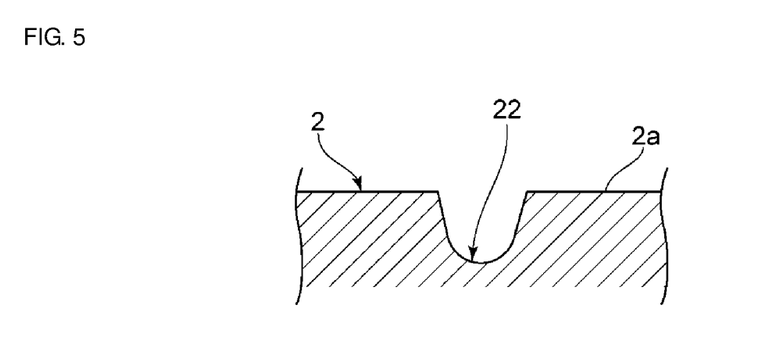
FIG. 5 is a partial cutout enlarged cross-sectional view illustrating another variation on the cross-sectional shape of the groove.

In another variation illustrated in FIG. 5, a groove 22 has a rounded shape in the cross section along the direction in which the first and second electrode fingers extend. In this manner, a cross-sectional shape of the groove may be variously changed. However, it is preferable that the cross-sectional shape be the inverted trapezoidal shape, such as the groove 17, or the cross-sectional shape be the rounded shape, such as the groove 22 illustrated in FIG. 5. In these cases, more types of unnecessary waves are able to be effectively reduced or prevented.

Additionally, as illustrated in FIG. 1A, in the groove 17, a dimension thereof in a direction extending in the elastic wave propagation direction is preferably narrower than the widths of the first and second electrode fingers 13 and 14. However, the widths of the grooves 17 and 18 may be the same or substantially the same as the widths of the first and second electrode fingers 13 and 14. In this case, the acoustic velocity difference is even more effectively increased.

Figure 6:
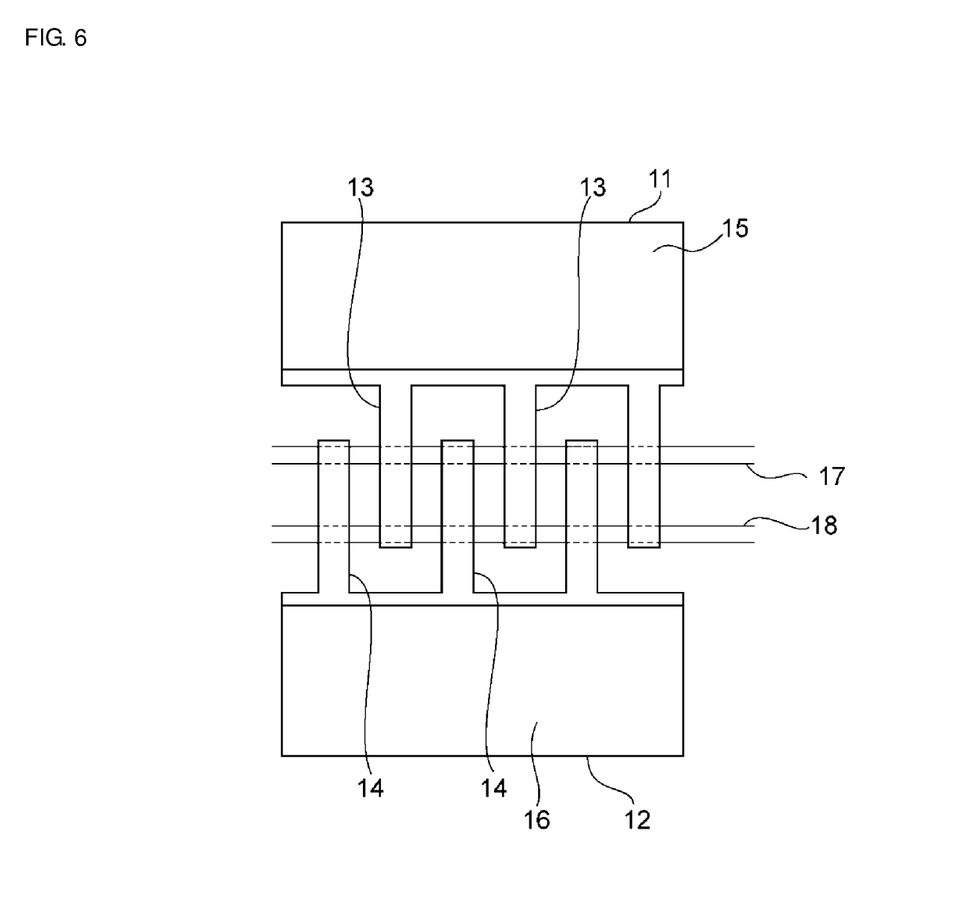
FIG. 6 is a schematic plan view illustrating the electrode structure of the elastic wave device for explaining still another variation on the groove.

Additionally, the grooves 17 and 18 may extend over end edges of the first and second electrode fingers 13 and 14 in a width direction. Furthermore, as illustrated in FIG. 6, the grooves 17 and 18 may connect the recess portions of the plurality of first electrode fingers 13 and the plurality of second electrode fingers 14. In this case, one groove extending in the elastic wave propagation direction may be provided in each of the first edge region R3 and the second edge region R4 respectively. Accordingly, processing is easily performed, and productivity is even further improved.

The acoustic velocity difference between the acoustic velocity V1 in the center region R2 and the acoustic velocity V2 in the first and second edge regions R3 and R4 is preferably not less than about 200 m/sec and not more than about 340 m/sec, for example. In this case, unnecessary waves are more effectively reduced or prevented. This will be described with reference to FIG. 7 to FIG. 10.

The elastic wave device 1 was manufactured using a 42° Y-cut LiTaO$_3$ as the piezoelectric substrate 2. As the metal film defining the IDT electrode 3 and the reflectors 4 and 5, an Al film was provided so as to have an electrode film thickness h/λ of about 14%, for example. Note that, at portions in which the first and second busbars 11 and 12 have been provided, a metal film made of an Al film with a thickness of about 3 μm, for example, was stacked. An electrode finger intersecting width was set to about 57 μm, for example.

Note that, where a depth of the grooves 17 and 18 in the first and second edge regions R3 and R4 is represented by D, D/λ was set to about 14%, for example.

The shape of the above-described groove 17 was changed, and a plurality of types of elastic wave devices 1 were manufactured.

Figure 7:
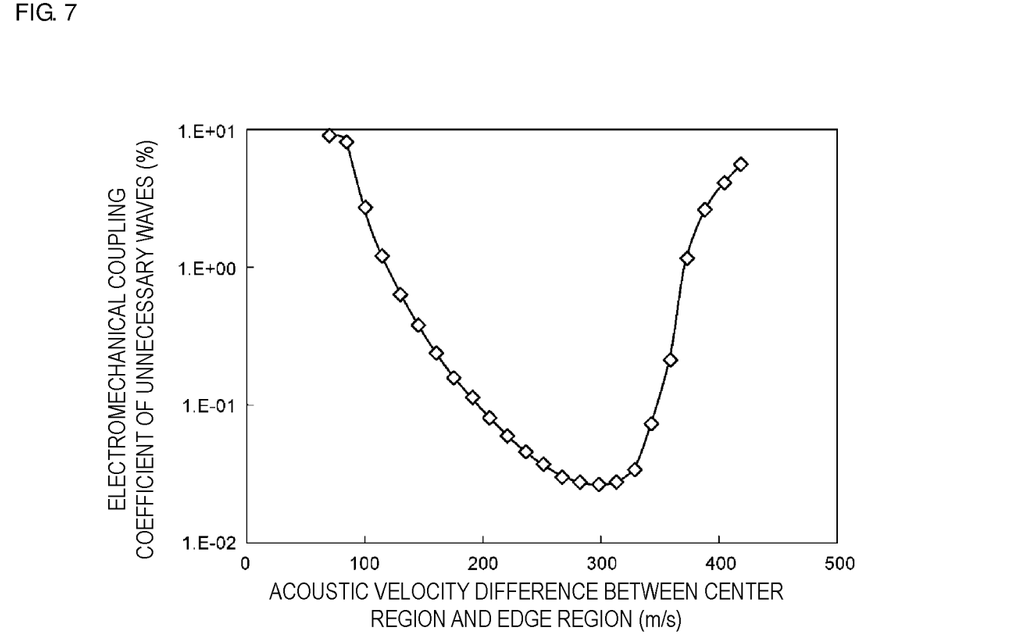
FIG. 7 is a diagram illustrating a relationship between an acoustic velocity difference between a center region and an edge region in a case in which a 42° Y-cut $LiTaO_3$ substrate is used and an electromechanical coupling coefficient of unnecessary waves.

Electromechanical coupling coefficients (%) of the unnecessary waves in the plurality of types of elastic wave devices were obtained. FIG. 7 is a diagram illustrating a relationship between the acoustic velocity difference between the acoustic velocity V1 in the center region R2 and the acoustic velocity V2 in the first and second edge regions R3 and R4 and the electromechanical coupling coefficient (%) of the unnecessary waves. Note that, the acoustic velocity V1 in the center region R2 was about 3882 m/sec, for example.

The acoustic velocity V2 in the first and second edge regions R3 and R4 was changed in a range of not less than about 3462 m/sec and not more than about 3812 m/sec, for example. In other words, the acoustic velocity difference between the acoustic velocity V1 and the acoustic velocities V2 was changed in a range of not less than about 70 m/sec and not more than about 420 m/sec, for example.

As illustrated in FIG. 7, when the acoustic velocity difference between the acoustic velocity V1 and the acoustic velocity V2 is not less than about 200 m/sec and not more than about 340 m/sec the electromechanical coupling coefficient of the unnecessary waves becomes about $1\times10^{-1}$(%)= about 0.1% or less, and it can be seen that the unnecessary waves are effectively reduced or prevented.

Next, using the same piezoelectric substrate, without changing the dimensions of the first and second edge regions R3 and R4, the electrode finger intersecting width in the IDT electrode was changed. Additionally, for comparison, in an elastic wave device in a comparative example, which was manufactured in the same or similar manner as described above except that the groove defining the recess portion was not included, the intersecting width was changed in the same manner.

Note that, of the elastic wave, the acoustic velocity V1 in the center region R2 is about 3882 m/sec, and the acoustic velocity V2 in the first and second edge regions R3 and R4 is about 3582 m/sec, for example. Accordingly, the acoustic velocity difference between the acoustic velocity V1 and the acoustic velocity V2 is about 300 m/sec, for example.

Figure 8:
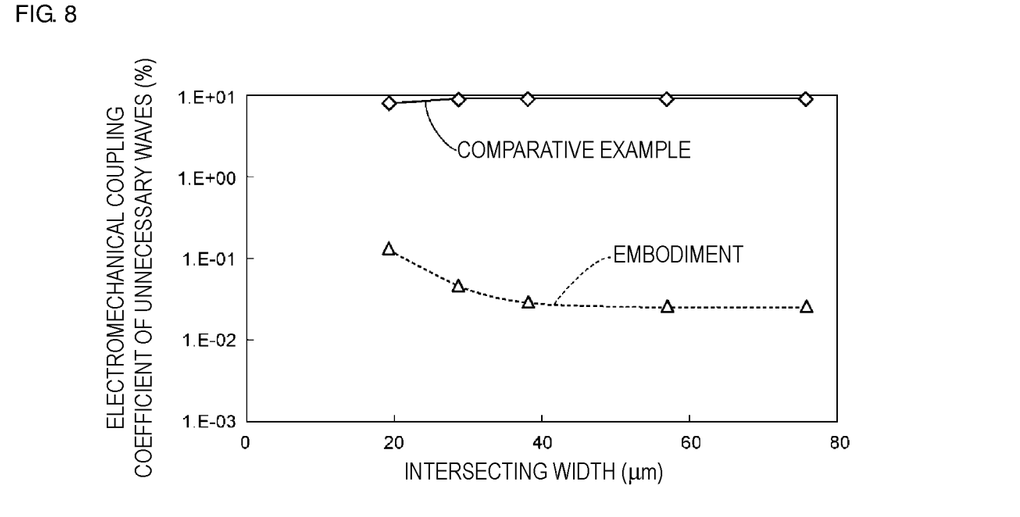
FIG. 8 is a diagram illustrating a relationship between an electrode finger intersecting width in a case in which the 42° Y-cut $LiTaO_3$ substrate is used and the electromechanical coupling coefficient of the unnecessary waves.

FIG. 8 is a diagram illustrating a relationship between the electrode finger intersecting width and the electromechanical coupling coefficient of the unnecessary waves in the preferred embodiment of the present invention and the comparative example described above. As is clear from FIG. 8, in the comparative example, even if the electrode finger intersecting width is changed, the electromechanical coupling coefficient of the unnecessary waves cannot be sufficiently reduced. However, according to the present preferred embodiment, it can be seen that the unnecessary waves is effectively reduced or prevented and the electromechanical coupling coefficient of the unnecessary waves is even further reduced when the intersecting width is set to not less than about 40 μm, for example. Additionally, it can be seen that variation in the influence of the unnecessary waves due to the change of the intersecting width is also small in a range in which the intersecting width is not less than about 40 μm and not more than about 80 μm, for example.

Accordingly, it is preferable that the intersecting width be not less than about 40 μm, that is, be not less than about 20λ in a value in which the intersecting width is normalized by a wave length λ of surface acoustic waves, for example. It is more preferable that the intersecting width be not more than about 80 μm, that is, be not more than about 40λ in a normalized value by the wave length λ of the surface acoustic waves, for example.

Next, the piezoelectric substrate was changed from the 42° Y-cut LiTaO$_3$ to a 0° Y-cut LiNbO$_3$ substrate, in the same manner as the above-described experimental example, the acoustic velocity difference between the acoustic velocity V1 and the acoustic velocity V2 was changed by changing the shapes of the grooves 17 and 18 defining the recess portions. In this case, the acoustic velocity V1 in the center region R2 was about 3653 m/sec, for example. The shapes of the grooves 17 and 18 were changed such that the acoustic velocity V2 in the first and second edge regions R3 and R4 is not less than about 3233 m/sec and not more than about 3583 m/sec, for example. In this case, the acoustic velocity difference between the acoustic velocity V1 and the acoustic velocity V2 was in a range of not less than about 70 m/sec and not more than about 420 m/sec, for example. The electrode finger intersecting width was set to about 57 μm, for example.

Figure 9:
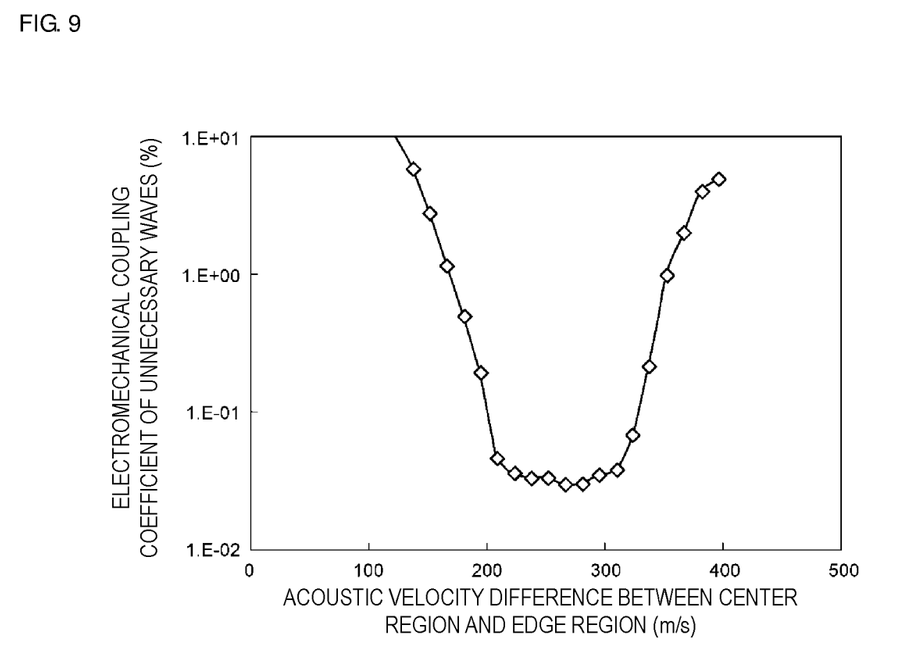
FIG. 9 is a diagram illustrating a relationship between the acoustic velocity difference between the center region and the edge region in a case in which a 0° Y-cut $LiNbO_3$ substrate is used and the electromechanical coupling coefficient of the unnecessary waves.

FIG. 9 is a diagram illustrating a relationship between the acoustic velocity difference between the acoustic velocity V1 and the acoustic velocity V2 and the electromechanical coupling coefficient of the unnecessary waves. As is clear from FIG. 9, in a case in which the piezoelectric substrate is the 0° Y-cut LiNbO$_3$ substrate, when the acoustic velocity difference is not less than about 200 m/sec and not more than about 340 m/sec, the electromechanical coupling coefficient of the unnecessary waves is reduced to not more than about 0.1%, for example.

Additionally, in the experiment using the LiNbO$_3$ substrate, the acoustic velocity V1 in the center region R2 was about 3653 m/sec, and the acoustic velocity V2 in the first and second edge regions R3 and R4 was about 3383 m/sec, for example, the electrode finger intersecting width was changed. For comparison, the same or substantially the same structure as that of the present preferred embodiment was prepared as a second comparative example except for a structure in which the recess portion was not provided. In this case, the acoustic velocity difference between the acoustic velocity V1 and the acoustic velocity V2 was about 270 m/sec, for example, in the present preferred embodiment, and was 0 in the second comparative example.

The above-described intersecting width was changed in a range of not less than about 20 μm and not more than about 80 μm, for example, and elastic wave devices of the preferred embodiments and the second comparative example described above were manufactured.

Figure 10:
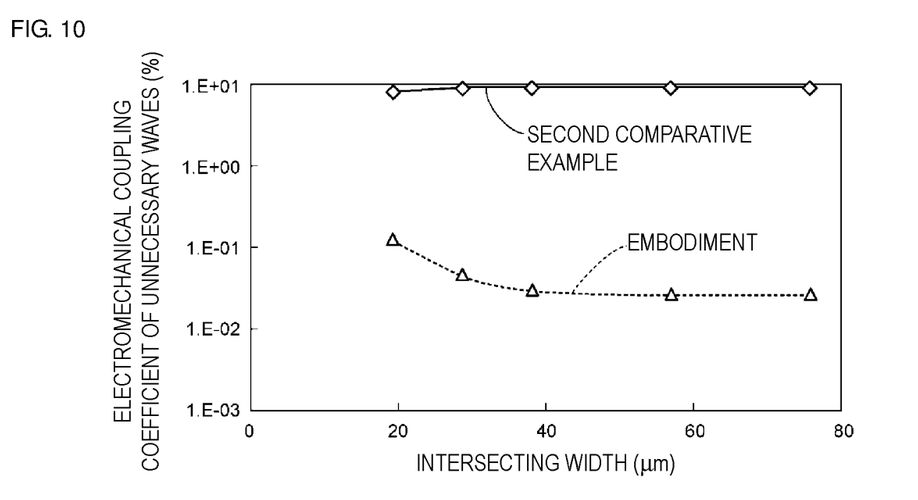
FIG. 10 is a diagram illustrating a relationship between the electrode finger intersecting width in a case in which the 0° Y-cut $LiNbO_3$ substrate is used and the electromechanical coupling coefficient of the unnecessary waves.

FIG. 10 illustrates a relationship between the electrode finger intersecting width and the electromechanical coupling coefficient of the unnecessary waves. As illustrated in FIG. 10, in the second comparative example, even if the electrode finger intersecting width was changed, the electromechanical coupling coefficient of the unnecessary waves could not be effectively reduced.

In contrast, in the above-described preferred embodiment, in a case in which the LiNbO$_3$ substrate is used, in comparison with the second comparative example, the electromechanical coupling coefficient of the unnecessary waves is sufficiently reduced. Additionally, it can be seen that, when the intersecting width is not less than about 40 μm, the electromechanical coupling coefficient of the unnecessary waves is even further reduced, and variation in the electromechanical coupling coefficient of the unnecessary waves due to the change of the intersecting width is also small. Accordingly, it is preferable that the intersecting width be not less than about 40 μm, that is, not less than about 20λ in a normalized value by the wave length λ of the surface acoustic waves, for example. It is more preferable that the intersecting width be not more than about 80 μm, that is, not more than about 40λ in a normalized value by the wave length λ of the surface acoustic waves, for example.

As described above, in the elastic wave device 1, the acoustic velocity difference between the acoustic velocity V1 and the acoustic velocity V2 is preferably not less than about 200 m/sec and not more than about 340 m/sec, for example, and with this, the unnecessary waves are even more effectively reduced or prevented. Note that, in the above-described preferred embodiment, although the grooves 17 and 18 are formed when forming the first and second edge regions R3 and R4, the recess portion in the present invention is not limited to the groove, and can be changed to various shapes.

Additionally, by changing the dimension of the opening portion of the grooves 17 and 18, the dimension of the bottom surface of the grooves 17 and 18, a slope angle of the side surface of the grooves 17 and 18, and other parameters thereof, the acoustic velocity difference is able to be easily adjusted.

Figure 11A:
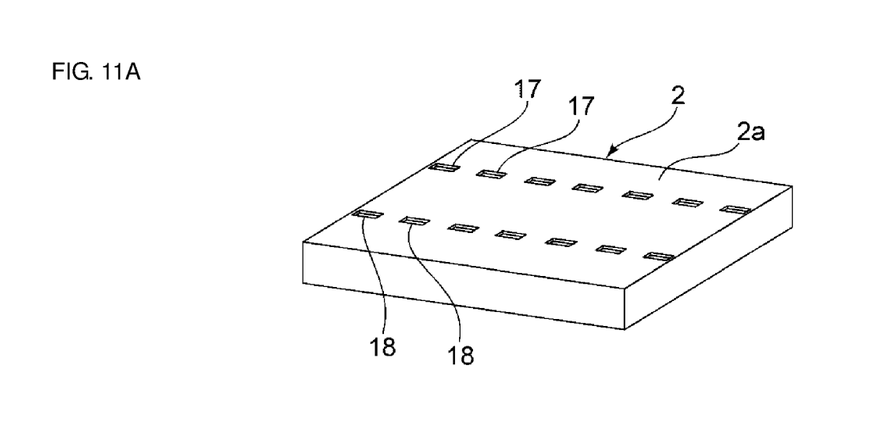
FIGS. 11A to 11C are perspective views for explaining a manufacturing method of an elastic wave device according to a preferred embodiment of the present invention.
Figure 11B:
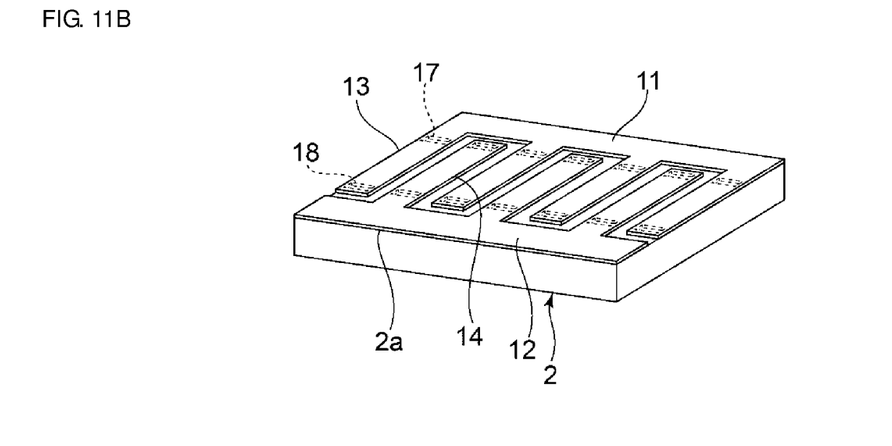
Figure 11C:
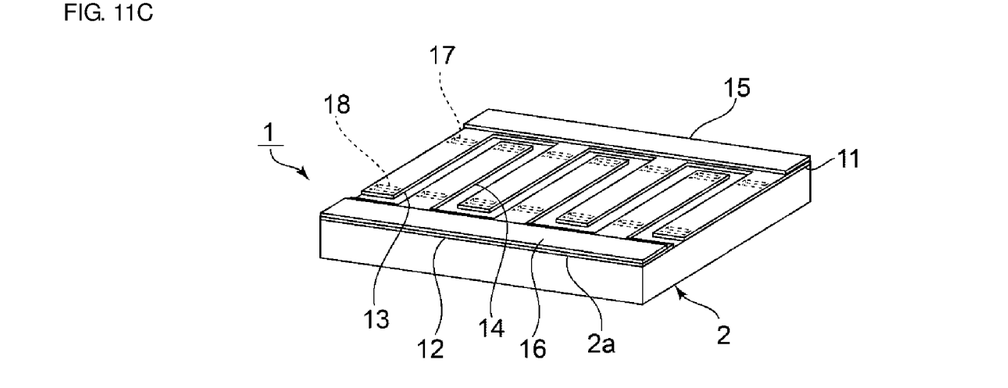

FIG. 11A to FIG. 11C are perspective views for explaining a manufacturing method of the elastic wave device 1. First, as illustrated in FIG. 11A, the piezoelectric substrate 2 in which the grooves 17 and 18 defining the recess portions are provided on the one main surface 2a is prepared. A method for providing the grooves 17 and 18 is not particularly limited, an appropriate method, such as a laser process, a method of etching after placing a mask, or other suitable method, for example, may be used.

Next, as illustrated in FIG. 11B, on the one main surface 2a of the piezoelectric substrate 2, a metal film defining a first layer is film-formed. With this, the first and second busbars 11 and 12 and the first and second electrode fingers 13 and 14 are formed. In this case, by forming a film by a deposition method, such as vapor deposition, sputtering, or other suitable method, for example, the first and second electrode fingers 13 and 14 are disposed in the grooves 17 and 18 illustrated in FIG. 1A. Accordingly, as illustrated in FIGS. 1A and 1B, the first and second electrode fingers 13 and 14 are formed such that the first and second electrode fingers 13 and 14 are disposed in the grooves 17 and 18.

Next, as illustrated in FIG. 11C, on the first and second busbars 11 and 12, the metal films 15 and 16 defining the second layers are film-formed. In this manner, the elastic wave device 1 is obtained.

As is clear from the above-described manufacturing method, when forming the first and second edge regions R3 and R4, after preparing the piezoelectric substrate 2 in which the grooves 17 and 18 are provided beforehand, only by forming a film once, the first and second edge regions R3 and R4 are able to be formed. Accordingly, it can be seen that simplification of manufacturing steps and a cost reduction are achieved.

In the above-described preferred embodiments, although a single port type elastic wave resonator is described, the present invention is not limited to the elastic wave resonator, can be applied to various elastic wave devices such as an elastic wave filter or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate; and
   an IDT electrode provided on the piezoelectric substrate; wherein
   the IDT electrode includes a first busbar, a second busbar separated from the first busbar, a plurality of first electrode fingers each including one end connected to the first busbar, and a plurality of second electrode fingers each including one end connected to the second busbar;
   the plurality of first electrode fingers and the plurality of second electrode fingers are interdigitated with each other, a portion in which the first electrode fingers and the second electrode fingers overlap with each other in an elastic wave propagation direction is defined as an intersection region, the intersection region includes, in a direction in which the first and second electrode fingers extend, a center region located on a central portion and first and second edge regions respectively disposed on both sides of the center region;
   in the first and second edge regions, recess portions are provided on the piezoelectric substrate, the first and second electrode fingers are provided in the recess portions, and are disposed on the piezoelectric substrate in the recess portions; and
   where an acoustic velocity of elastic waves in the center region is represented by V1, an acoustic velocity of elastic waves in the first and second edge regions is represented by V2, and an acoustic velocity of elastic waves in regions on sides of the first and second edge regions opposite from the center region is represented by V3, V3>V1>V2 is satisfied.

2. The elastic wave device according to claim 1, wherein an acoustic velocity difference between the acoustic velocity V1 and the acoustic velocity V2 is not less than about 200 m/sec and not more than about 340 m/sec.

3. The elastic wave device according to claim 1, wherein a portion of each of the first and second electrode fingers that is disposed inside of the recess portion is made of a material with a lower Young's modulus than a Young's modulus of the piezoelectric substrate.

4. The elastic wave device according to claim 3, wherein the portion of each of the first and second electrode fingers that is disposed inside of the recess portion is made of metal.

5. The elastic wave device according to claim 4, wherein the metal includes at least one metal layer made of at least one metal selected from a group consisting of Au, Cu, Pt, W, and Al or an alloy including the at least one type as the primary component.

6. The elastic wave device according to claim 1, wherein a density of a portion of each of the first and second electrode fingers that is disposed in the recess portion is higher than a density of the piezoelectric substrate.

7. The elastic wave device according to claim 6, wherein the portion that is disposed in the recess portion is made of one metal selected from a group consisting of Au, Cu, Pt, and W or an alloy including the metal as the primary component.

8. The elastic wave device according to claim 1, wherein the recess portion is a groove extending in the elastic wave propagation direction.

9. The elastic wave device according to claim 8, wherein a cross-sectional shape of the groove along the direction in which the first and second electrode fingers extend is an inverted trapezoidal shape.

10. The elastic wave device according to claim 8, wherein a cross-sectional shape of the groove along the direction in which the first and second electrode fingers extend is a rounded shape.

11. The elastic wave device according to claim 8, wherein the groove extends across an entire or substantially an entire width in a width direction of the first electrode finger or the second electrode finger in the elastic wave propagation direction.

12. The elastic wave device according to claim 8, wherein the groove has a dimension not more than a dimension in a width direction of the first or second electrode finger along the elastic wave propagation direction.

13. The elastic wave device according to claim 8, wherein the groove is larger than a dimension in a width direction of the first or second electrode finger in the elastic wave propagation direction, and extends to an outer side portion in the elastic wave propagation direction over end edges in the width direction of the first and second electrode fingers.

14. The elastic wave device according to claim 8, wherein the groove connects the recess portions of the plurality of first electrode fingers or the plurality of second electrode fingers.

15. A manufacturing method of an elastic wave device, the method comprising:
   forming an IDT electrode including a first busbar, a second busbar, a plurality of first electrode fingers, and a plurality of second electrode fingers on one main surface of a piezoelectric substrate, a plurality of recess portions being provided on the one main surface; wherein
   when forming the IDT electrode, in an intersection region in which the plurality of first and second electrode fingers overlap with each other when viewed from an elastic wave propagation direction, the intersection region includes a center region and first and second edge regions located in outer side portions of the center region in a direction in which the first and second electrode fingers extend;
   when forming the IDT electrode, the IDT electrode is formed such that the recess portions are located in the first and second edge regions; and each of the recess portions is a groove extending in the elastic wave propagation direction.

16. The manufacturing method of the elastic wave device according to claim 15, wherein a metal film defining a second layer is film-formed on at least a portion of each of the first and second busbars.

17. The manufacturing method of the elastic wave device according to claim 15, wherein a cross-sectional shape of the groove along the direction in which the first and second electrode fingers extend is an inverted trapezoidal shape.

18. The manufacturing method of the elastic wave device according to claim 15, wherein a cross-sectional shape of the groove along the direction in which the first and second electrode fingers extend is a rounded shape.

* * * * *